US 6,638,663 B1

(12) United States Patent
Jin (10) Patent No.: US 6,638,663 B1
(45) Date of Patent: Oct. 28, 2003

(54) PHASE-SHIFTING MASK AND SEMICONDUCTOR DEVICE

(75) Inventor: Feng Jin, Orlando, FL (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 09/488,662

(22) Filed: Jan. 20, 2000

(51) Int. Cl.⁷ .............. G03F 7/00; G03F 1/00
(52) U.S. Cl. .............. 430/5; 430/311; 430/313; 430/396
(58) Field of Search .............. 430/5, 311, 313, 430/322, 396; 257/213, 231, 246

(56) References Cited

U.S. PATENT DOCUMENTS

| 5,292,623 | A | * | 3/1994 | Kemp et al. ........... 430/313 |
| 5,573,890 | A | * | 11/1996 | Spence ........... 430/311 |
| 5,667,941 | A | * | 9/1997 | Okamoto et al. ........... 430/313 |
| 6,083,275 | A | * | 7/2000 | Heng et al. ........... 716/19 |
| 6,197,456 | B1 | * | 3/2001 | Aleshin et al. ........... 430/5 |
| 6,210,841 | B1 | * | 4/2001 | Lin et al. ........... 430/5 |
| 6,436,608 | B1 | * | 8/2002 | Jin ........... 430/311 |

FOREIGN PATENT DOCUMENTS

| EP | 0 090 924 A2 | 10/1983 |
| EP | 0 492 630 A2 | 7/1992 |
| EP | 0 730 200 A2 | 9/1996 |
| GB | 2 291 218 A | 1/1996 |

OTHER PUBLICATIONS

Liebmann et al, "*Alternating Phase Shifted Mask for Logic Gate Levels, Design and Mask Manufacturing*", SPIE vol. 3679 p. 27 (1999).
Levenson et al, IEEE Trans. Electron. Devices, ED–29, No. 12, p. 1828 (1982).

* cited by examiner

Primary Examiner—Janet Baxter
Assistant Examiner—Amanda C. Walke

(57) ABSTRACT

Disclosed is a phase-shifting mask having a pattern comprising a plurality of substantially transparent regions and a plurality of substantially opaque regions wherein the mask pattern phase-shifts at least a portion of incident radiation and wherein the phases are substantially equally spaced, thereby increasing resolution of a given lithographic system. Further disclosed is a semiconductor device fabricated utilizing the phase-shifting mask.

7 Claims, 7 Drawing Sheets

PHASE-SHIFTING MASK AND SEMICONDUCTOR DEVICE

TECHNICAL FIELD OF THE INVENTION

This invention relates to lithographic masks, such as that used for fabricating semiconductor devices.

BACKGROUND OF THE INVENTION

Lithography is utilized in semiconductor device manufacturing to pattern features on semiconductor workpiece layers for integrated circuit fabrication.

Figure 1:
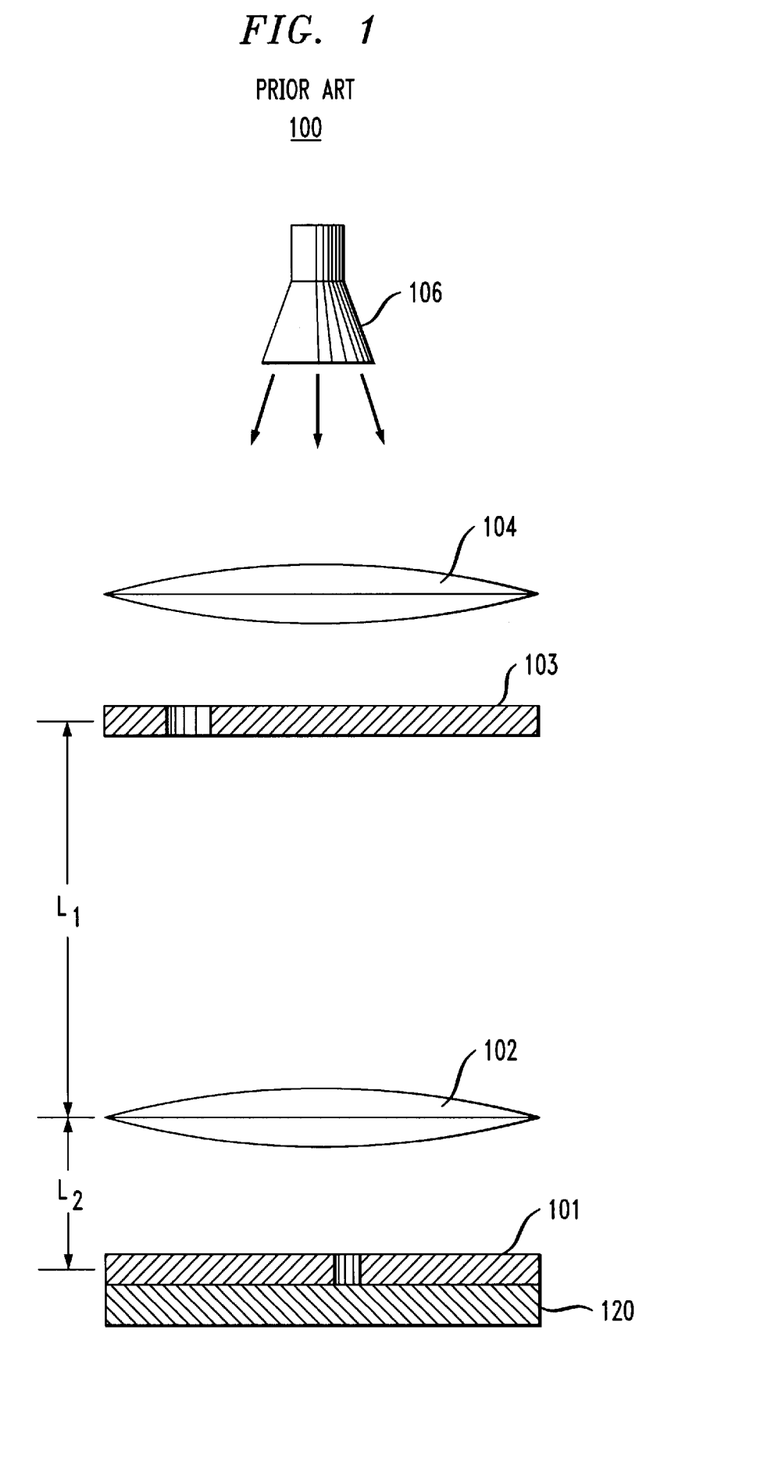
FIG. 1 depicts a prior art lithographic system useful in the practice of the invention.

FIG. 1 shows a lithographic fabrication system 100 for defining features in a workpiece 120, in accordance with prior art. Typically, workpiece 120 comprises a semiconductor substrate, together with one or more layers of substances (not shown) such as silicon dioxide and a resist layer 101, affixed to a surface of workpiece 120.

Typically, radiation of wavelength $\lambda$ is emitted by an optical source 106, such as a mercury lamp or a laser. The radiation propagates through an optical collimating lens or lens system 104, a patterned lithographic mask 103 having a pattern of opaque and transparent features, and an optical projection lens or lens system 102. The radiation transmitted through mask 103 is imaged by lens 102 onto resist layer 101, thereby exposing a patterned area corresponding to the mask pattern. If resist layer 101 is positive, exposed areas will be subject to removal after development and if it is negative, exposed areas will remain intact. Thus, the pattern of mask 103 is transferred to ("printed on") resist layer 101. "Mask" as used herein means "mask" and/or "reticle".

As known in the prior art, the indicated distances $L_1$ and $L_2$ satisfy, in cases of a simple lens 102, $1/L_1 + 1/L_2 = 1/F$, where F is the focal length of lens 102. A pattern produced by mask 103 on resist layer 101 will be substantially in focus if resist layer 101 is a distance $L_2$ from projection lens 102. This conclusion is based on a geometrical optics analysis which assumes light travels in straight lines. However, when the feature size is comparable to $\lambda/NA$, where $\lambda$ is the illumination wavelength, and NA is the numerical aperture of the projection lens, a physical optics analysis should be considered which includes the wave nature of light. Under this analysis diffraction effects are likely to be produced, decreasing the image resolution even at distance $L_2$, thereby reducing resolution of component features. For semiconductor devices it is desirable to maximize the number of circuit components per unit area by minimizing component size. As component size decreases, diffraction effects become more significant, thereby limiting reduction in component size. Decreased sharpness of mask images caused by diffraction effects may reduce product yield and increase device failure rate.

Figure 2A:
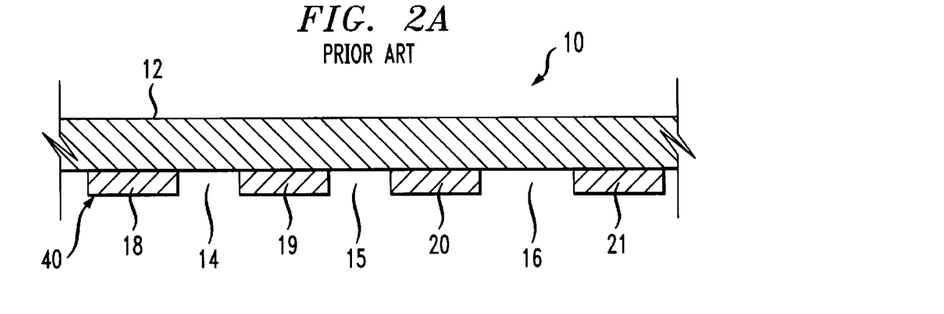
FIGS. 2A–2D depict a prior art binary mask.
Figure 2B:
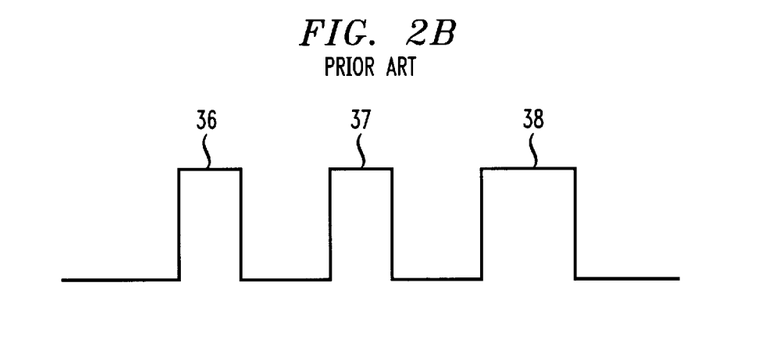
Figure 2C:
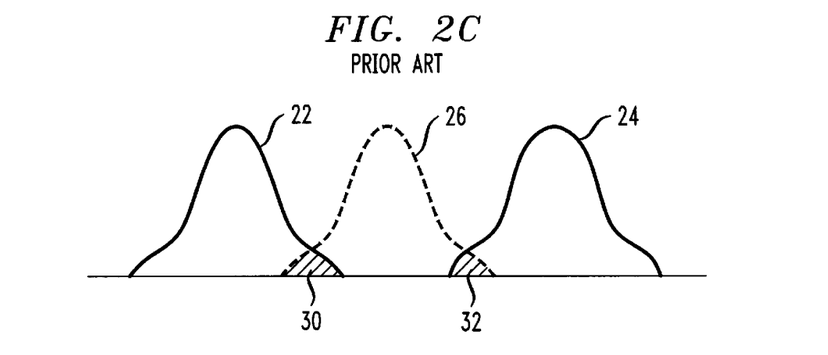

Diffraction effects may be severe for conventional or binary masks. FIG. 2A depicts a cross-sectional view of a prior art binary mask 10. Binary mask 10 typically comprises a glass or quartz layer 12 with a patterned chromium layer 40 affixed thereto. The patterned chromium layer comprises a plurality of substantially transparent areas 14, 15 and 16 and a plurality of attenuating areas 18, 19, 20 and 21. Electromagnetic radiation propagating through areas 14, 15 and 16 have electric fields associated therewith. Amplitudes of the electric fields at the mask level are represented with respect to a cross-section of the mask in FIG. 2B, wherein steps 36, 37 and 38 correspond to electric fields from radiation propagating through apertures 14, 15 and 16, respectively. Because of the wave-nature of the radiation it spreads as it propagates. Therefore, even though the electric fields are separated from one another at mask level they may interfere with one another a distance away from the mask, such as at a workpiece surface. This is shown in FIG. 2C. Due to the diffraction effect, it is clear that the electric field at the workpiece surface spreads wider relative to that at the mask level. The smaller the feature sizes, as represented by transparent areas 14, 15, and 16, the wider the spread.

Figure 2D:
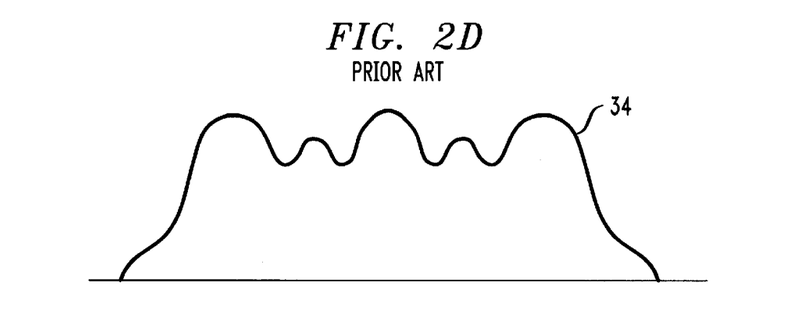

Solid lines 22 and 24 in FIG. 2C represent electric fields from apertures 14 and 16, respectively, and broken line 26 represents an electric field from aperture 15. The amplitudes of the electric fields from adjacent openings (14 and 15, for example) overlap in cross-hatched regions 30 and 32. As shown in FIG. 2D, this interference or constructive addition of electric field amplitudes results in an electric field 34 which has a higher intensity at the workpiece surface in regions 30 and 32, relative to the surrounding areas than at mask level. Therefore, there is less contrast in the light intensity distribution at the workpiece surface than at mask level, thereby reducing the resolution capability of the tool.

Undesirable diffraction effects become more significant with small dimension pattern features. "Small dimension" as used herein means small size and small spacing between transparent regions relative to $\lambda/NA$, where $\lambda$ is the wavelength of the optical source and NA is the numerical aperture of the projection system.

It is known in the art to improve the system resolution by employing phase-shifting masks. The mask imparts a phase-shift to the incident radiation, typically by $\pi$ radians. Phase-shifting masks generally comprise transparent areas having an optical intensity transmission coefficient T, near 1.0 at the incident radiation wavelength $\lambda$, attenuating areas or partially transparent areas having T at $\lambda$ in the range of about 0.05 to about 0.15, and, optionally, opaque areas, having T less than or equal to about 0.01.

Figure 3A:
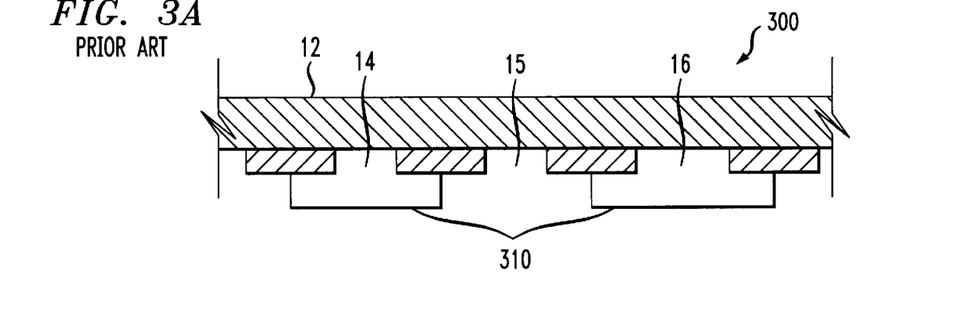
FIGS. 3A–3E depict a prior art $\pi$ radian phase-shifting mask.
Figure 3B:
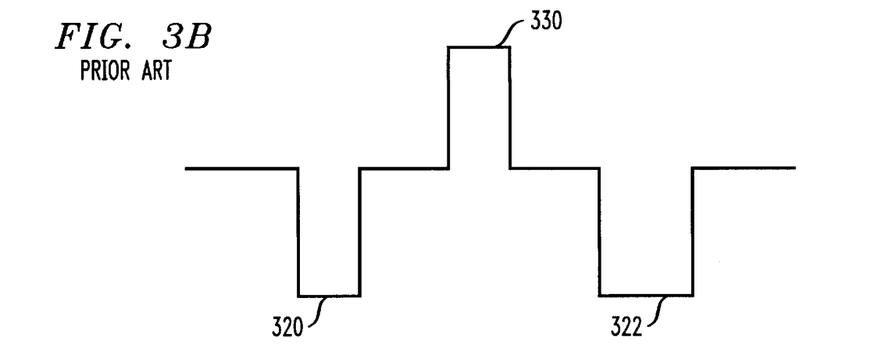
Figure 3C:
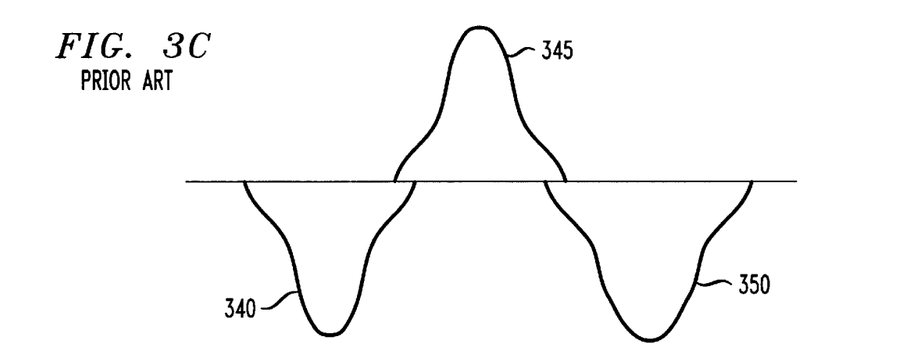
Figure 3D:
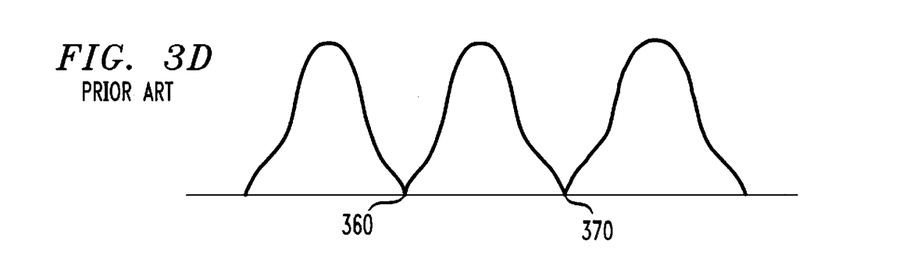
Figure 3E:
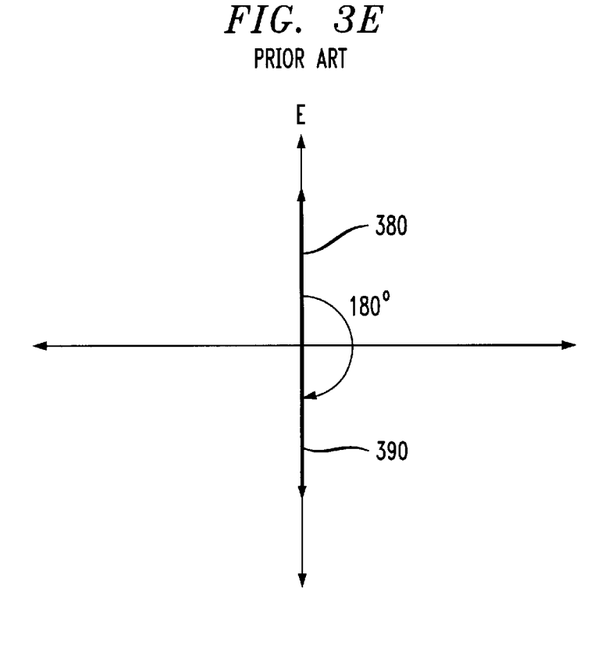

FIG. 3A depicts a cross-sectional view of a prior art $\pi$ radian-phase-shifting mask 300. Mask 300 is substantially similar to binary mask 10 but includes a phase-shifter layer 310 over transparent regions 14 and 16. Phase-shifter layer 310 reverses the direction of the electric field vectors at apertures 14 and 16 relative to aperture 15 as shown in FIG. 3B at 320, 322 and 330. The $\pi$ radian phase-shift is created by employing a phase-shifter layer 310 with a thickness of $d = \lambda/2(n-1)$ where $\lambda$ is the wavelength of the optical source and n is the refractive index of layer 310 at $\lambda$. The phase-shifter layer modifies the optical distance traveled by incident radiation, thereby producing a phase-shift. As is shown in FIG. 3C, by peaks 340, 345 and 350, the overlapping regions of adjacent electric fields have opposite amplitudes, and therefore, a destructive interference occurs. The cancellation of the electric field at those locations improves the contrast of the intensity field as shown in FIG. 3D. FIG. 3E depicts a vector diagram of the electric field at a workpiece level produced by radiation propagating through a $\pi$ radian-phase-shifting mask. Vector 380 represents an electric field from unshifted radiation such as passes through aperture 15. Vector 390 corresponds to phase-shifted radiation such as that which propagates through aperture 14 and phase-shifter 310. The amplitude of vector 390 equals the negative of the amplitude of vector 380, thereby canceling it out upon interference.

Phase-shifting masks producing $\pi$ radian shifts are an improvement over binary masks. However, they do not fully resolve all resolution problems, for example a phase conflict may arise for feature configurations in which a phase transition is generally unavoidable. Whenever a phase transition occurs a dark line will result.

Electric field interference has been addressed by using a mask having a $\pi/2$ radian shift and a $3/2\pi$ radian shift. Liebmann et al, "Alternating Phase Shifted Mask for Logic Gate Levels, Design and Mask Manufacturing", SPIE vol. 3679 p. 27 (1999). It is also known in the art to use $\pi:2/3\pi:1/3\pi:0$ radian shifting masks.

It is therefore desirable to reduce phase conflict thereby substantially eliminating undesirable lines, and thus facilitating feature size reduction and improving product yield and reliability.

SUMMARY OF THE INVENTION

The invention relates to a phase-shifting mask having substantially equally spaced phases thereby substantially eliminating zeroth order and reducing first order diffraction frequencies. One embodiment of the invention relates to a three-phase-shifting mask having a pattern composed of substantially transparent regions and substantially opaque regions wherein the mask pattern phase-shifts incident radiation by 0, $2/3\pi$ and $4/3\pi$ radians. The invention further relates to a semiconductor device fabricated utilizing the phase-shifting mask. In such applications the invention facilitates reduction in component size and improved device reliability.

DETAILED DESCRIPTION OF THE INVENTION

It will be appreciated that the following description is intended to refer to specific embodiments of the invention selected for illustration and is not intended to define or limit the invention, other than in the appended claims.

The invention comprises a phase-shifting mask having substantially equally spaced phases such that the zeroth order diffraction frequency is substantially canceled and the first order diffraction frequency is reduced as compared to nonphase-shifting masks or masks having unequally spaced phases. Any number of equally spaced phases may provide substantially similar pattern transferring results and are within the spirit and scope of the invention. However, the phase-shifting mask preferably has three equally spaced phases to simplify manufacturing. Phase-shifting masks having phase shifts of $1/3\pi$ radian multiples can be fabricated by layering readily available $1/3\pi$ radian phase-shifting components.

Figure 4A:
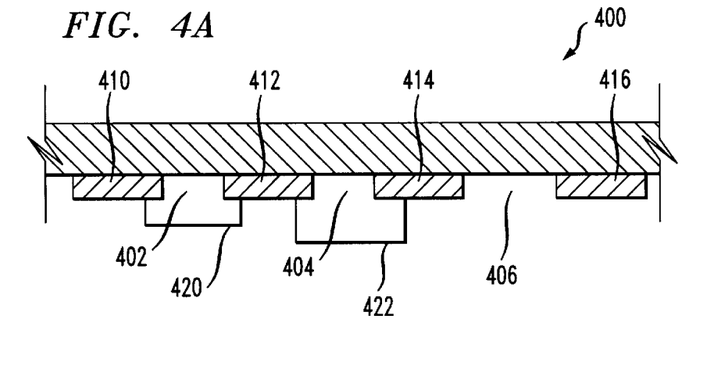
FIGS. 4A–4E depict a three-phase-shifting mask of the invention.
Figure 4B:
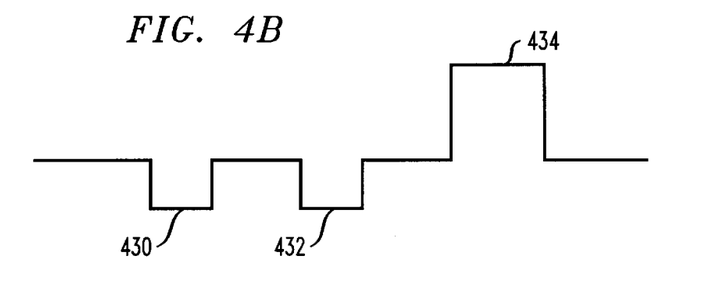
Figure 4C:
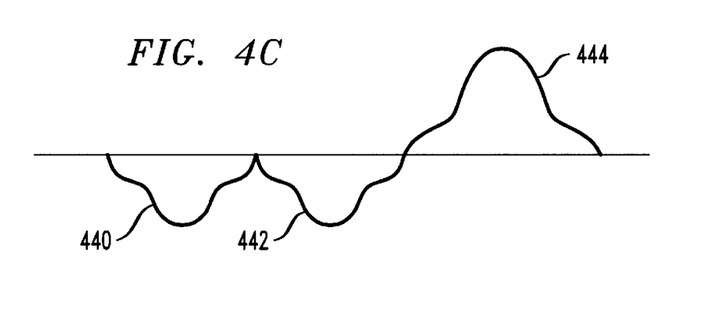
Figure 4D:
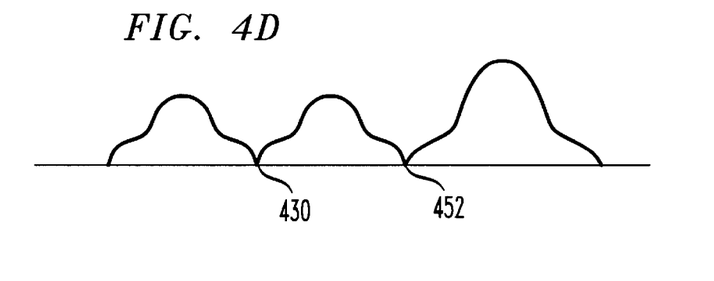

FIG. 4A depicts a cross-sectional view of a three-phase-shifting mask 400. Three-phase-shifting mask 400 has a plurality of substantially transparent areas 402, 404 and 406 and a plurality of substantially opaque areas 410, 412, 414 and 416. Extending across apertures 402 and 404 are phase-shifters, 420 and 422, respectively. Phase-shifter 420 produces a $2/3\pi$ radian shift and phase-shifter 422 produces a $4/3\pi$ radian shift. FIG. 4B shows the amplitudes of electric fields at mask level wherein the field areas from apertures 402 and 404 are represented by negative steps 430 and 432, respectively, and the field area from aperture 406 is represented by positive step 434. Since the electric fields are vectors by nature, FIG. 4B should be understood as a snapshot of the fields at a specific moment that will continually change with time. FIG. 4C represents electric fields 440, 442 and 444 at a workpiece from apertures 402, 404 and 406, respectively. Unlike the binary mask, the electric fields at the overlap region are added destructively. Therefore, where images on the workpiece surface from apertures 402, 404 and 406 meet, the intensity is substantially zero as shown in FIG. 4D at 450 and 452.

Figure 4E:
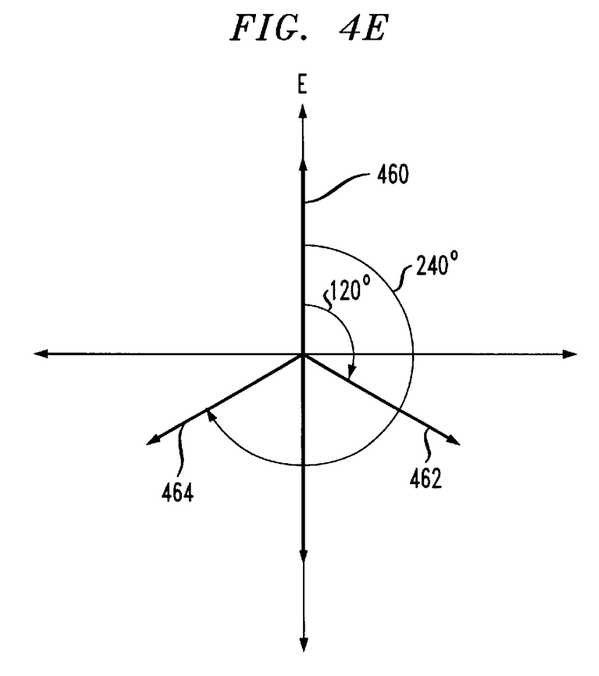

This phenomenon is further depicted in FIG. 4E. FIG. 4E depicts electric field vectors corresponding to an electric field at workpiece level for mask 400. It should be noted that the amplitudes of the electric fields are the projection of the vectors shown in the figure to the vertical axis. Vector 460 corresponds to an electric field produced by aperture 406 through which unshifted radiation is propagated. Vector 462 represents an electric field at workpiece level produced by radiation propagating through aperture 402 which is phase-shifted $2/3\pi$ radians by phase-shifter 420. Vector 464 defines an electric field at workpiece level of radiation propagating through aperture 404 and $4/3\pi$ radian phase-shifter 422. The amplitude of vectors 462 and 464 are substantially equal when vector 460 is at its maximum amplitude as shown in FIG. 4E. The vector array rotates clockwise with time at a frequency determined by the frequency of the incident radiation. As vector 460 rotates, its amplitude will decrease. As the amplitude of vector 460 decreases, the amplitude of vector 462 will become more negative and the amplitude of vector 464 will become less negative. However, the sum of the amplitudes of vectors 460, 462 and 464 will remain generally equal to zero, thereby substantially eliminating light intensity at the location where the electric fields overlap. For masks having any number of substantially equally spaced phases, corresponding electric field vectors will generally sum to zero.

Advantageously, the frequency component of three-phase-shift mask 400 is lower than binary mask 10 or $\pi$ radian phase-shifting mask 300. This makes it possible for radiation to pass through the limited numerical aperture of the projection lens, and therefore achieve higher resolution with a given system. This phenomenon will also be present for masks with other numbers of equally spaced phases.

Figure 5:
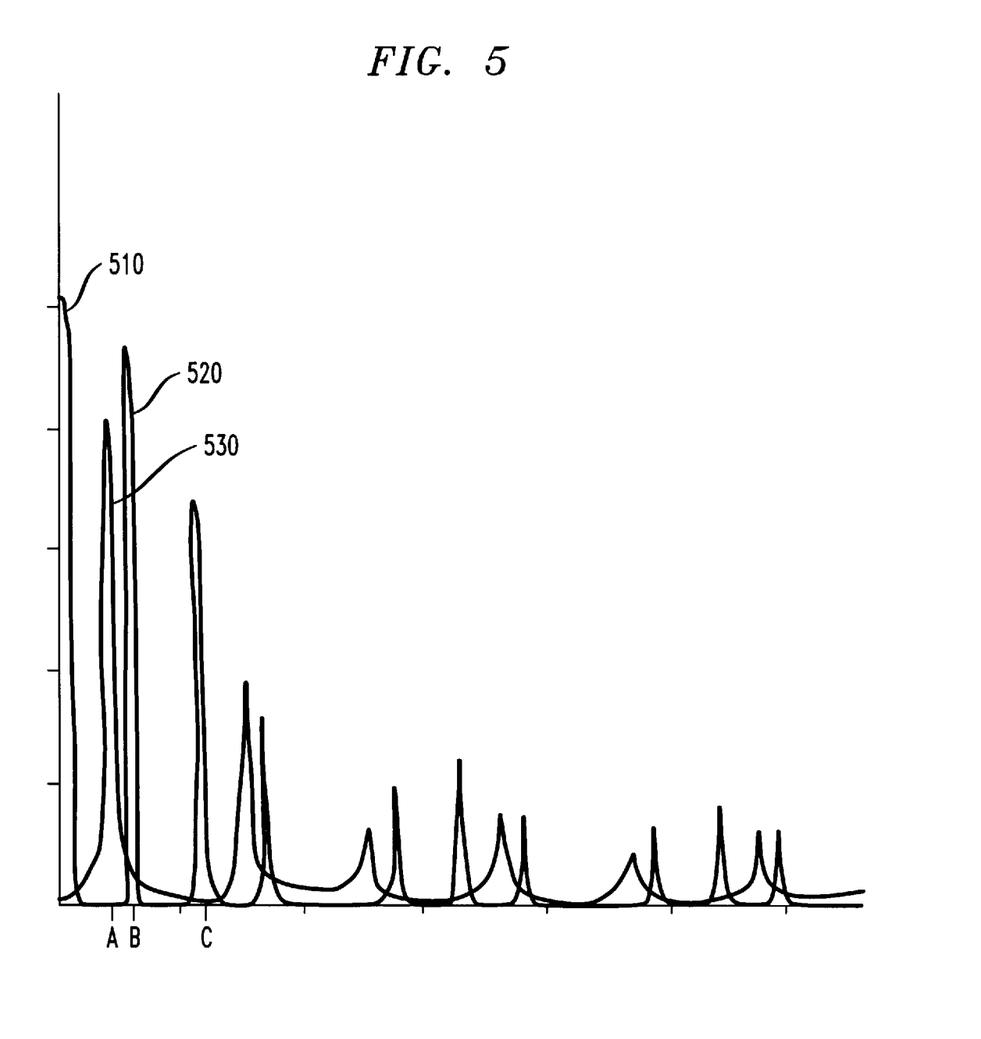
FIG. 5 depicts Fourier spectra of a three-phase-shift mask, a $\pi$ radian phase-shift mask and a binary mask.

FIG. 5 depicts Fourier spectra of a binary mask, a $\pi$ radian phase-shifting mask and an equally spaced three-phase-shifting mask. The zeroth order diffraction frequency is substantially eliminated and the first order diffraction frequency is reduced with the three-phase-shifting mask as compared to the binary and $\pi$ radian phase-shifting masks. Binary mask spectrum 510 indicates a first order diffraction frequency centered at C. $\pi$ radian phase-shifting mask spectrum 520 has a first order diffraction frequency centered at B indicating a lower frequency. Advantageously, three-phase-shifting mask spectrum 530 shows a center of its first order diffraction frequency to be at A indicating an even lower frequency than that of the $\pi$ radian phase-shifting mask. Lower diffraction frequency corresponds to improved resolution. Therefore, resolution with a three-phase-shifting mask will be better than that with a binary or $\pi$ radian phase-shifting mask, thereby facilitating formation of smaller features. Other equally spaced phase-shifting masks should produce results similar to those obtained from the three-phase-shifting mask.

Figure 6:
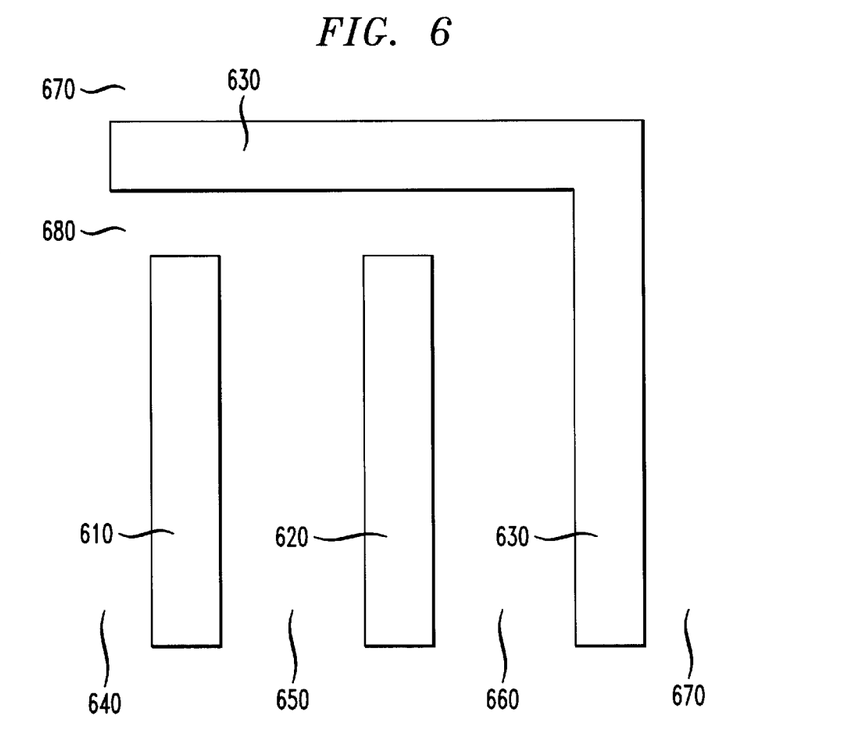
FIG. 6 depicts a mask pattern.

FIG. 6 depicts one example of a mask pattern in which a phase conflict is likely to occur with a π radian shift. FIG. 6 shows three opaque mask features 610, 620 and 630 surrounded by transparent areas 640, 650, 660, 670 and 680. If a π phase-shifting mask is employed to shift radiation propagated through transparent areas 640 and 660 by π radians, and radiation propagated through areas 650 and 670 are left unshifted or at zero, the electric field interference produced by diffraction of radiation propagating through transparent areas 640, 650 and 660 will be minimized. However, transparent area 680 has portions adjacent to transparent areas 640, 650 and 660 so that a phase transition is unavoidable between either 680 and 650 or between 680 and 640/660. Where the phase transition occurs, an undesirable dark line will usually be produced. This phenomenon is referred to as "phase conflict".

Advantageously, substantially equally spaced phase-shifting masks reduce phase conflict. For example, for the mask pattern depicted in FIG. 6, by introducing a third phase and having the phases equally spaced, features 650, 660 and 680 can have different phases from one another, thereby substantially eliminating phase conflict. Furthermore, transparent area 640 can have the same phase as transparent area 660 without producing a phase conflict. Because interference of the electric fields from the three features is substantially eliminated, unwanted dark lines will generally be eliminated.

The preferred mask thickness will depend on its application and on the mask material. For example, in a photolithographic process used in the fabrication of semiconductor devices the mask thickness is preferably in the range of about 0.22 cm to about 0.64 cm. It will be understood by those skilled in the art that any mask thickness will be suitable that allows the transmission of radiation sufficient to transfer the mask pattern to the workpiece and which has the structural integrity necessary to withstand the process in which it is used.

The preferred mask material will also depend on the application for which the mask is used. For example, masks typically comprise glass or quartz when used in photolithographic processes in the manufacture of semiconductor devices. Any material sufficient to withstand the particular lithographic process for which it is used and through which sufficient radiation may be transmitted to transfer the mask pattern to the workpiece may be utilized. Additional examples of mask materials include, but are not limited to, silicon dioxide fluorides, alkaline metals fluorides and alkaline earth fluorides. Calcium fluorides and magnesium fluorides are particularly well suited as mask materials.

In a lithographic process radiation is propagated through the mask and focused with a lens onto a workpiece coated with resist. If a negative resist is used, exposed areas will remain intact. If a positive resist is employed, exposed areas will be removed. By this process, the pattern of the mask will be transferred to the workpiece. Areas in which resist has been removed may then undergo additional processes, for example etching and plating, to form features on the workpiece in a desired pattern.

Figure 7:
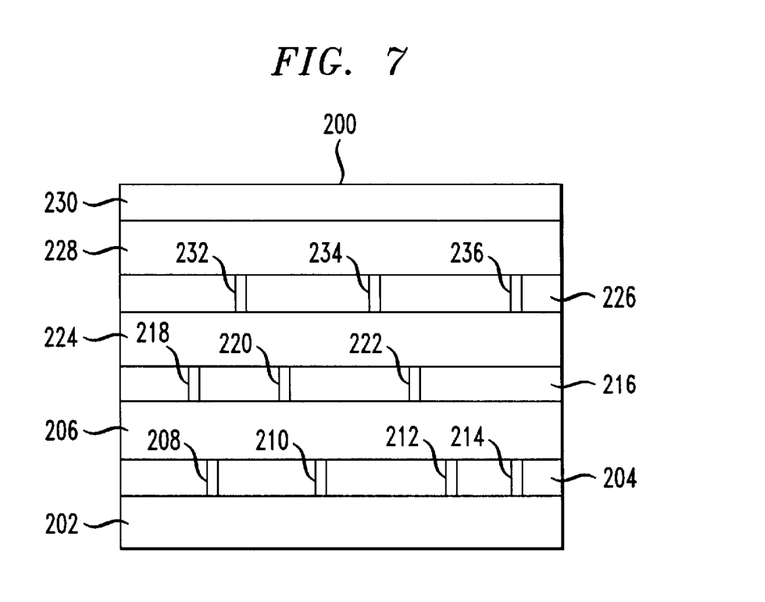
FIG. 7 depicts a semiconductor device.

The invention further includes a semiconductor device which, when formed using a substantially equally spaced phase-shifting mask, should have better feature definition than that which is formed using a prior art mask, primarily due to improved resolution. FIG. 7 depicts a schematic of a semiconductor device 200 that may be formed using a substantially equally spaced phase-shifting mask. Those skilled in the art will understand that it shows a simplified drawing of semiconductor device 200 for illustrative purposes only. An actual device may have layers of varying thicknesses and may contain other components. Semiconductor substrate 202 is covered by a first dielectric layer 204. Above first dielectric layer 204 is a first metal layer 206. Vias or interconnects 208, 210, 212 and 214 penetrate layer 204 and conductively connect first metal layer 206 to semiconductor substrate 202. First metal layer 206 is covered by second dielectric layer 216 which contains vias 218, 220 and 222 to connect first metal layer 206 to a second metal layer 224. This layering sequence may be repeated as necessary as shown in part by layers 226 and 228, and interconnects 232, 234 and 236. A top passivation layer 230 may be applied to protect device 200 from adverse electrical, chemical or other conditions, and to provide electrical stability.

Semiconductor substrate 202 may comprise silicon, for example. Common dielectrics include, but are not limited to, silicon oxides, such as boron phosphorous doped silicate glass (BPSG), those originating from tetraethylorthosilicate (TEOS) and silicon dioxide ($SiO_2$). Common metals include, for example, aluminum, copper and tungsten. In addition, to improve adherence between metal and dielectric layers, thin layers may be introduced between them. Titanium is commonly used for this purpose. Electronic circuitry is defined in the layers by a lithographic technique.

In the lithographic process used to form the circuitry in device 200 a resist is deposited over a dielectric layer. The resist is exposed by transmitting radiation through the substantially equally spaced phase-shifting mask onto the dielectric layer surface, thereby defining desired circuitry and substantially eliminating phase conflict. The form of radiation used is dependent on the type of resist and other fabrication parameters. Any form of radiation that may expose the resist without adverse effects to the workpiece may be used. Common examples include, ultraviolet radiation, electron beam radiation and x-rays. If a positive resist is used, the exposed areas will be removed revealing the dielectric layer below. The dielectric layer may then be removed, for example by etching. Any technique that will remove the exposed dielectric layer while leaving the resist covered portions intact may also be used. Negative resists may be used wherein the exposed resist areas are left intact after exposure and the nonexposed areas are removed. For negative resist processes a mask is used that defines the spaces between circuit components rather than the circuitry itself Lithographic processes using the substantially equally spaced phase shifting mask may also be employed to form other device features, for example interconnects in the dielectric layers. The phase-shifting mask described herein is not limited in use to semiconductor device fabrication and may, within the spirit and scope of the invention, be used for any lithographic process in which it would facilitate transfer of a pattern to a workpiece.

What is claimed is:

1. A phase-shifting mask having a pattern comprising a plurality of substantially transparent regions and a plurality of substantially opaque regions wherein the mask pattern phase-shifts at least a portion of incident radiation on the plurality of substantially transparent regions and wherein the phases are substantially equally spaced such that their corresponding electric field vectors sum to zero.

2. The mask of claim 1 wherein the radiation is shifted by about 0, about 2/3π and about 4/3π radians.

3. The mask of claim 1 wherein the incident radiation is ultraviolet light.

4. The mask of claim 1 wherein the mask is a photolithography mask.

5. The mask of claim 1 wherein the mask has a thickness in the range of about 0.22 cm to about 0.64 cm.

6. The mask of claim 1 wherein the mask is made from a material selected from the group consisting of glass, quartz, silicon dioxide fluoride, alkaline earth fluorides and alkaline metal fluorides.

7. A three-phase-shifting mask having a pattern comprising a plurality of substantially transparent regions and a plurality of substantially opaque regions wherein the mask pattern phase-shifts at least a portion of the radiation incident on at least a first substantially transparent region by about $2/3\pi$ radians and on at least a second substantially transparent region by about $4/3\pi$ radians, and allows a portion of the radiation to pass through at least a third substantially transparent region essentially unshifted such that their corresponding electric field vectors sum to zero.

\* \* \* \* \*